United States Patent [19]

Furuyama

[11] Patent Number: 5,343,430
[45] Date of Patent: Aug. 30, 1994

[54] METHOD AND CIRCUITRY FOR SCREENING A DYNAMIC MEMORY DEVICE FOR DEFECTIVE CIRCUITS

[75] Inventor: Tohru Furuyama, Tokyo, Japan
[73] Assignee: Kabushiki Kaisha Toshiba, Kawasaki, Japan
[21] Appl. No.: 695,014
[22] Filed: May 3, 1991
[30] Foreign Application Priority Data
May 11, 1990 [JP] Japan .................. 2-119949
[51] Int. Cl.⁵ .................. G11C 7/00; G11C 29/00
[52] U.S. Cl. .................. 365/201; 365/222
[58] Field of Search .................. 365/222, 201, 233
[56] References Cited
U.S. PATENT DOCUMENTS

| 4,494,222 | 1/1985 | White et al. | 365/222 |
| 4,672,583 | 6/1987 | Nakaizumi | 365/201 X |
| 4,934,826 | 6/1990 | Miyatake et al. | 365/222 |
| 4,943,960 | 7/1990 | Komatsu et al. | 365/222 |
| 4,984,210 | 1/1991 | Kumanoya et al. | 365/222 |
| 5,016,220 | 5/1991 | Yamagata | 365/189.01 X |
| 5,031,147 | 7/1991 | Maruyama et al. | 365/222 X |
| 5,151,881 | 9/1992 | Kajigaya et al. | 365/201 X |
| 5,157,629 | 10/1992 | Sato et al. | 365/201 |

FOREIGN PATENT DOCUMENTS 61-076968  8/1986  Japan .
WO82/00917  3/1982  PCT Int'l Appl. .

OTHER PUBLICATIONS

Co-pending U.S. patent application Ser. No. 544,614 Filed Jun. 27, 1990.

Primary Examiner—Seungsook Ham
Attorney, Agent, or Firm—Banner, Birch, McKie & Beckett

[57] ABSTRACT

A dynamic memory device includes a refresh counter, a row circuit, and a column AV5VpVcircuit. The dynamic memory device has a screening refresh mode for activating a circuit block in response to a signal other than a refresh address signal externally supplied, the circuit block including a refresh counter, row circuit, and column circuit.

21 Claims, 6 Drawing Sheets

METHOD AND CIRCUITRY FOR SCREENING A DYNAMIC MEMORY DEVICE FOR DEFECTIVE CIRCUITS

BACKGROUND OF THE INVENTION

1. Field of the Invention

The present invention relates to a semiconductor memory device and, more particularly, to a dynamic random access memory (DRAM) and a method for screening the same.

2. Description of the Related Art

A screening process is generally performed to expose latent defects in semiconductor devices and remove from finished batches those devices having defects. This screening process prevents defect-free devices from being adversely affected by defective devices and ensures the reliability of the finished semiconductor devices before and after they are put on the market. According to one screening method, semiconductor devices are operated using a voltage higher than the actual working voltage, and voltage stress is applied to the semiconductor devices for a period of time longer than the initial failure period under actual working conditions. The semiconductor devices are then screened and those which are considered likely to malfunction in initial operation are removed. This type of screening is an efficient method of removing defective devices, thereby enhancing the reliability of finished semiconductor devices.

Conventionally, when a screening test of DRAMs is performed, an address signal supplied from outside of the DRAM is scanned and input to an address signal terminal of each individual DRAM which is packaged, and the word lines of the DRAM are accessed in sequence. Using this method, however, a number of input terminals are required in the DRAM in order to perform the screening test, and an address signal generator has to be provided alongside the screening apparatus.

The inventors of the present invention have proposed a semiconductor memory device wherein voltage stress can be applied simultaneously to all of the word lines, or to a larger number of the word lines than that selected in a normal operation mode. This semiconductor memory device is disclosed in U.S. patent application Ser. No. 544,614 filed Jun. 27, 1990.

The semiconductor memory device proposed by the inventors greatly improves the efficiency of screening tests of transfer gates of memory cells. When the semiconductor memory device is in the form of a wafer, memory chip regions of the wafer can be screened in a short period of time by means of a prober and a probe card and, in this case, a number of probe terminals (for example, needles of the probe card) are not needed.

When a screening test is carried out using the above-described conventional method, probe terminals are brought into contact with address signal pads on DRAM chip regions on a wafer to scan the address signals supplied from outside of the DRAM and access the word lines of the DRAMs in sequence. From the point of view of screening efficiency, it is desirable that the probe terminals be simultaneously placed in contact with the address signal pads of as many DRAM chip regions on the wafer as possible (ideally, the pads on all the DRAM chip regions). However, in this case, a large number of probe terminals are required, it is difficult to attain such a probe card, and an address signal generator must be provided alongside the prober.

SUMMARY OF THE INVENTION

It is accordingly an object of the present invention to provide a DRAM device in which the number of input terminals required for screening of the DRAM device are decreased, and to provide a method for the screening.

According to one aspect of the present invention, there is provided a dynamic memory device comprising a refresh counter, a row circuit, and a column circuit, the dynamic memory device having a screening refresh mode for activating a circuit block including the refresh counter, the row circuit, and the column circuit, in response to a signal other than a refresh address signal externally supplied.

According to another aspect of the present invention, there is provided a method for screening a dynamic memory device having a screening refresh mode set in response to a signal other than a refresh address signal supplied from outside of the DRAM, wherein the screening refresh mode is set when the dynamic memory device is in a wafer form.

According to another aspect of the present invention, there is provided a method for screening a dynamic memory device having a CBR (CAS Before RAS Refresh) mode and/or an ROR (RAS Only Refresh) mode, wherein the CBR or ROR mode is designated by a signal supplied from outside of the DRAM (CAS is a column address strobe and RAS is a row address strobe).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
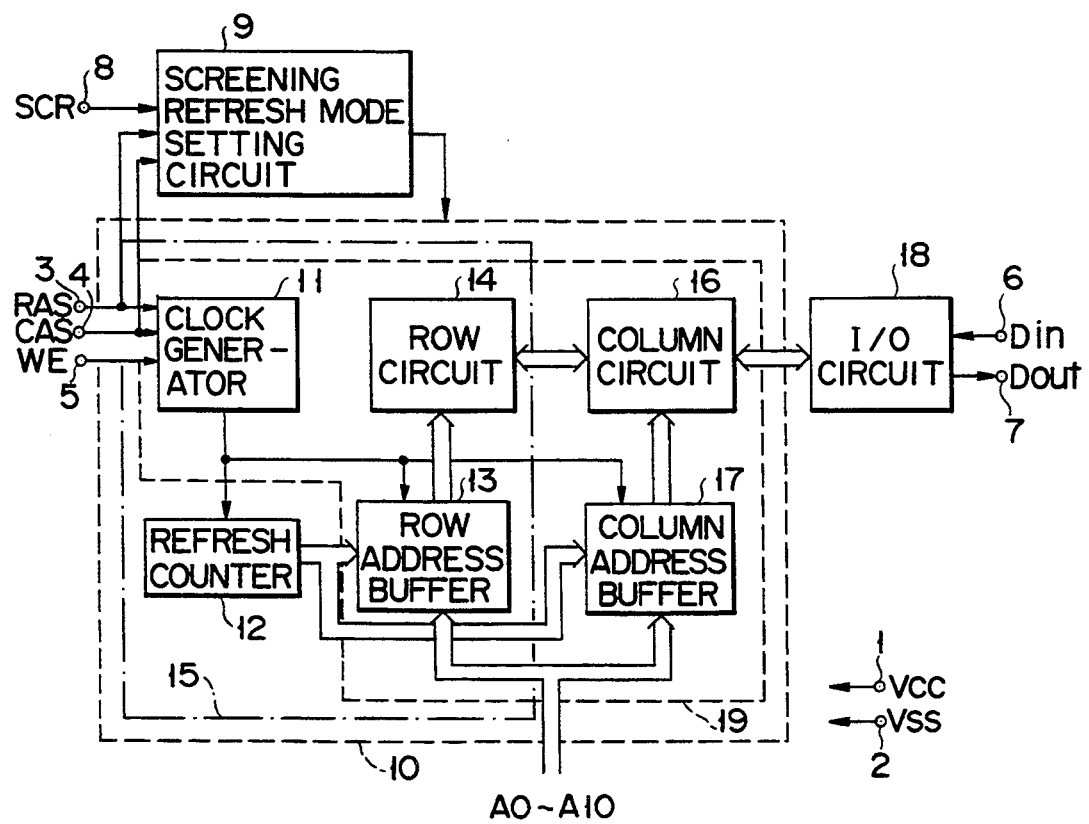
FIG. 1 is a block diagram schematically showing a DRAM according to the first embodiment of the present invention.

A DRAM according to an embodiment of the present invention will be described with reference to the accompanying drawings. The same components are denoted by the same reference numerals throughout the drawings to avoid repeating the descriptions of the same components in the specification.

FIG. 1 is a block diagram schematically showing a DRAM according to the first embodiment of the present invention.

The DRAM shown in FIG. 1 has a CBR (CAS Before RAS Refresh) mode and/or an ROR (RAS Only Refresh) mode in order to facilitate a refresh operation, like a standard DRAM. The DRAM also has a screening refresh mode described later.

In FIG. 1, reference numeral 1 indicates a power source terminal at a high potential; $V_{CC}$, a power source potential; 2, a power source terminal (ground terminal) at a low potential; $V_{SS}$, a ground potential; 3, a row address strobe (RAS) terminal for receiving an RAS signal; 4, a column address strobe (CAS) terminal for receiving a CAS signal; 5, a write enable (WE) terminal for receiving a WE signal; 6, a data input terminal; $D_{in}$, data input; 7, a data output terminal; $D_{out}$, data output; 11, a clock generator; 12, a refresh counter; 13, a row address buffer for receiving a row address signal or an output signal of the refresh counter 12; 14, a row circuit (e.g., a word drive circuit); A0 to A10, address signals; 15, a circuit block including a group of circuits activated by designating the CBR mode; 16, a column circuit (e.g., a circuit for reading data out of a sense amplifier); 17, a column address buffer for receiving a column address signal or an output signal of the refresh counter 12; 18, an input/output (I/O) circuit; and 19, a circuit block including a group of circuits activated by designating the ROR mode.

A terminal 8 is supplied with a screening signal SCR for switching between a normal operation and a screening operation, and the screening signal SCR is input to a screening refresh mode setting circuit 9. The circuit 9 sets an operation mode (corresponding to the screening refresh mode) for activating a circuit block 10, in response to a signal other than a refresh address signal supplied from outside of the DRAM.

The circuit block 10 includes the clock generator 11, refresh counter 12, row address buffer 13, row circuit 14, column circuit 16, and column address buffer 17.

Figure 2:
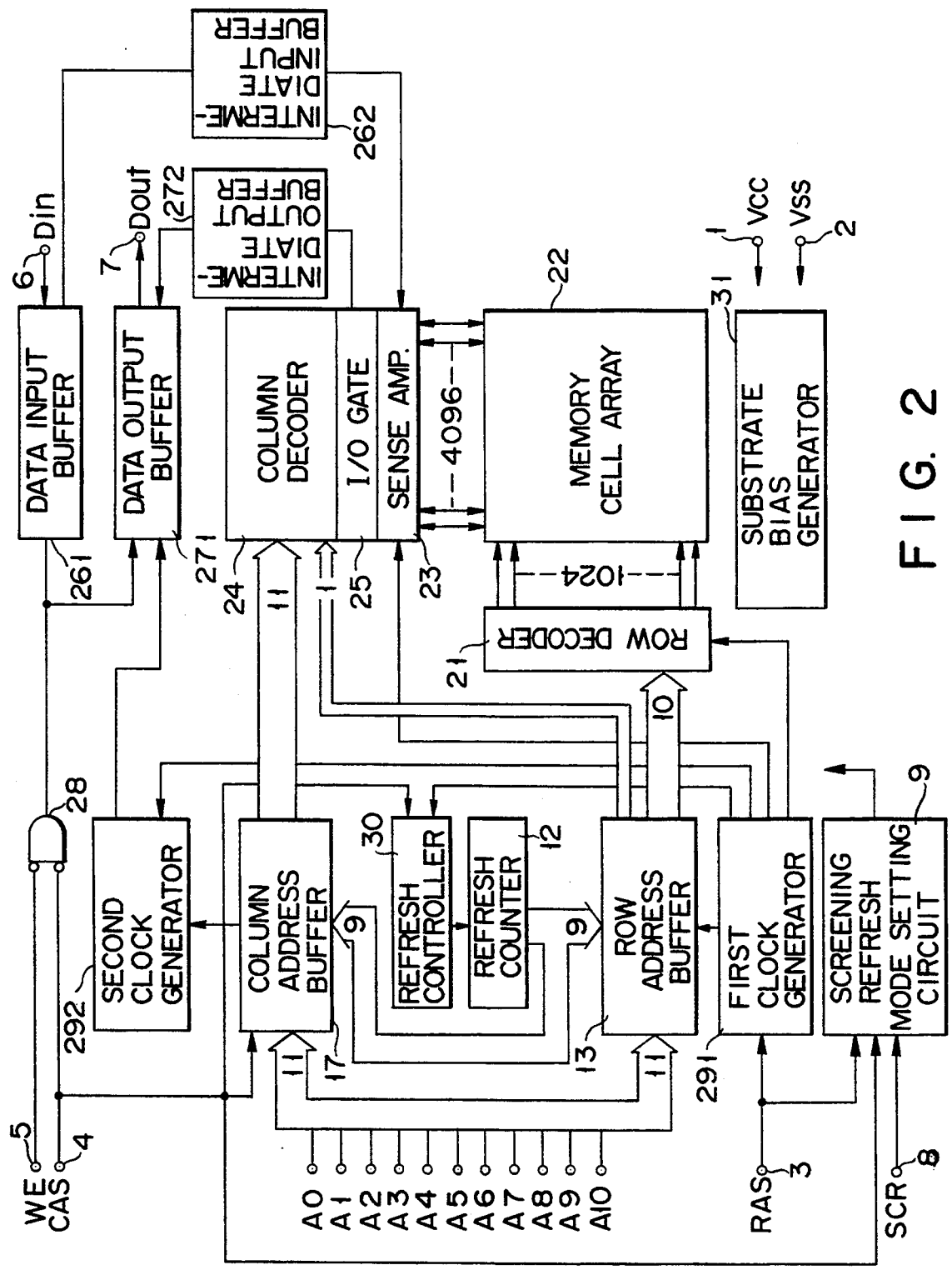
FIG. 2 is a block diagram minutely showing the DRAM shown in FIG. 1.

FIG. 2 is a block diagram minutely showing the DRAM of the first embodiment having a 4M×1 bit structure.

In FIG. 2, reference numeral 21 denotes a row decoder; 22, a memory cell array; 23, a sense amplifier; 24, a column decoder; 25, an I/O gate; 261, a data input buffer; 262, an intermediate input buffer; 271, a data output buffer; 272, an intermediate output buffer; 28, a control signal input buffer; 291, a first clock signal generator; 292, a second clock signal generator; 30, a refresh controller; and 31, a substrate bias generator. The clock signal generators 291 and 292 constitute the clock generator 11. The row decoder 21, memory cell array 22, and sense amplifier 23 are included in the row circuit 14. The column decoder 24, I/O gate 25, intermediate input buffer 262, intermediate output buffer 272 are included in the column circuit 16.

The data input buffer 261 and data output buffer 271 constitute the I/O circuit 18.

Figure 3A:
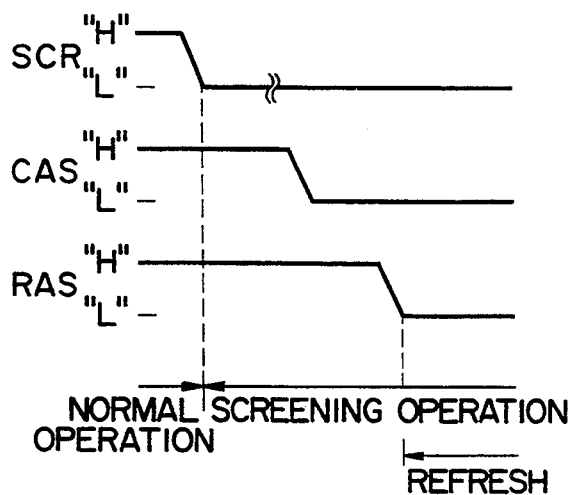
FIGS. 3A and 3B are views of timing waveforms representing operations of different examples of a screening refresh mode setting circuit of the DRAM shown in FIG. 1.
Figure 3B:
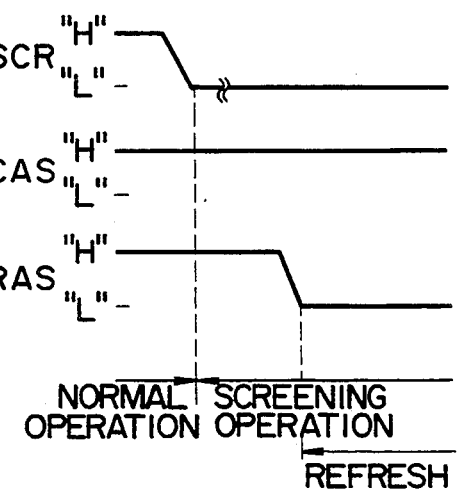

There are two examples of the screening refresh mode setting circuit 9. According to one of the examples, a logic circuit of screening refresh mode setting circuit 9 is so constructed as to detect that the CBR mode is designated when the screening signal SCR is input (when an activation level is low), as is apparent from the timing waveform shown in FIG. 3A. Then the circuit block 10 is activated by a detection output of the logic circuit. According to the other example, a logic circuit is so constructed as to detect that the ROR mode is designated when the screening signal SCR is input (when the activation level is low), as is apparent from the timing waveform in FIG. 3B. Then the logic block 10 is activated by a detection output of the logic circuit. Since it is unnecessary to use the CAS terminal 4 when the ROR mode is designated, the number of external terminals required for setting the screening refresh mode is decreased by one corresponding to the CAS terminal 4. To render the CAS terminal 4 in an inactive state (at a high level), it is desirable that a high resistance be connected between the CAS terminal 4 and power source potential $V_{CC}$ and the input CAS signal is pulled up to a high level.

In the screening refresh mode, an output signal of the refresh counter 12 is input in common to the row address buffer 13 and column address buffer 17 in order to uniformly apply a stress to the row circuit 14 and column circuit 16. Furthermore, the screening refresh mode disables the output buffer 271 of the I/O circuit 18 from operating, as in the ROR mode in the normal operation.

The operation of the DRAM shown in FIG. 1 in the CBR and ROR modes will be described. The CBR mode is designated by activating the CAS signal first and then the RAS signal. If the CBR mode is designated in the normal operation, the circuit block 15 including the refresh counter 12 and row circuit 14 is operated, and a refresh address signal is supplied from the refresh counter 12 to the row address buffer 13, thereby refreshing memory cells (not shown) of the memory cell array 22. The ROR mode is designated by not activating the CAS signal, but rather activating the RAS signal only. If the ROR mode is designated in the normal operation, the circuit block 19, which includes not only the row circuit 14 but also the column circuit 16 minus output buffer 271, is operated, but the refresh counter 12 is not operated. If a refresh address signal is supplied from outside of the DRAM in this state, the memory cells are refreshed.

In screening test the DRAM shown in FIG. 1, when a screening refresh mode is set, a refresh address signal is generated from the refresh counter 12, and the circuit block 10 including the row and column circuits 14 and 16 is operated, thereby refreshing the memory cells.

More specifically, when the DRAM shown in FIG. 1 is packaged or in the form of a wafer, if the screening refresh mode is set only by supplying a signal other than the refresh address signal from outside the chip regions, the word lines (not shown) of the memory cell array 22 are accessed in sequence without receiving any refresh address signal from outside the chip regions, and a stress is applied to the transfer gates of the memory cells to the utmost; accordingly, the screening can be performed. In this screening, the required input terminals on the DRAM chip regions, or the signals input from the terminals are reduced in number, and no address signal generator needs to be provided at the side of a screening apparatus. If a plurality of chips is screened together using a prober and a prober card when the DRAM is in the form of a wafer, the probe terminals required per chip on the wafer is decreased in number. Therefore, the probe card can be easily made, the screening can be easily performed, and no address signal generator needs to be provided at a side of the prober.

Figure 4:
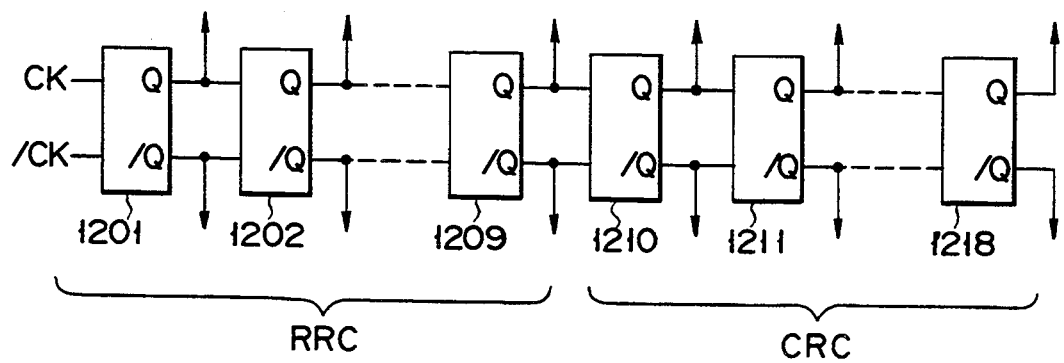
FIG. 4 is a logic circuit diagram showing a modification to a refresh counter of the DRAM shown in FIG. 1.

FIG. 4 is a logic circuit diagram showing a modification to the refresh counter 12.

The refresh counter shown in FIG. 4 includes a row refresh counter RRC and a column refresh counter CRC and is so constructed that an output of the column refresh counter CRC is carried by one if the row refresh counter RRC produces a round of outputs. More specifically, set/reset type flip-flops 1201 to 1218 are connected in series so that outputs signals Q and $\overline{Q}$ of the preceding flip-flop, which are complementary to each other, are supplied as input signals of the succeeding flip-flop, and the flip-flops constitute a frequency dividing circuit. The flip-flop 1201 at the first stage is supplied with clock signals CK, $\overline{CK}$ complementary to each other which are generated from the clock generator 11 when the screening refresh mode is set. The flip-flops 1201 to 1218 at their respective stages divide the frequencies of their input signals in half. The flip-flops at the first to ninth stages constitute the row refresh counter RRC, and a 9-bit output signal of the row refresh counter RRC is supplied to the row address buffer 13 through a multiplexer (not shown).

The flip-flops 1210 to 1218 at the tenth to eighteenth stages constitute the column refresh counter CRC, and a 9-bit output signal of the column refresh counter CRC is supplied to the column address buffer 17 through the multiplexer (not shown). The output signal of the column refresh counter CRC is used only when the screening is performed.

In the DRAM shown in FIG. 1, the data output buffer 271 Of the I/O circuit 18 is not caused to operate in the screening refresh mode. The buffer 271 can be however operated in this mode. If data output terminal 7 is rendered in a floating state in view of potential, an increase in current due to data output is a small matter. It is thus possible to apply a dynamic stress to the data output buffer 271 of the I/O circuit 18.

In the DRAM shown in FIG. 1, if all contents of the memory cells become "0" or "1" after a lapse of a predetermined time after power is applied, the sense amplifier 23 of the row circuit 14 operates so that a selected one of a paired bit lines (not shown) of the memory cell array 22, which are complementary to each other, the selected bit line being at the memory cell side, is always at a low level. Each of the bit lines is set at a low level at the same ratio and therefore the dynamic stress is uniformly applied to the sense amplifying system. If the data output buffer 271 is operated, "0" and "1" are output at the same ratio and the dynamic stress is uniformly applied. The DRAM thus allows an expected stress to be applied, without using an input data generator.

When the dynamic stress is applied by input data, the input data can be supplied from outside of the chips. It is more desirable to decrease the number of external terminals for screening, as in a DRAM shown in FIG. 5.

Figure 5:
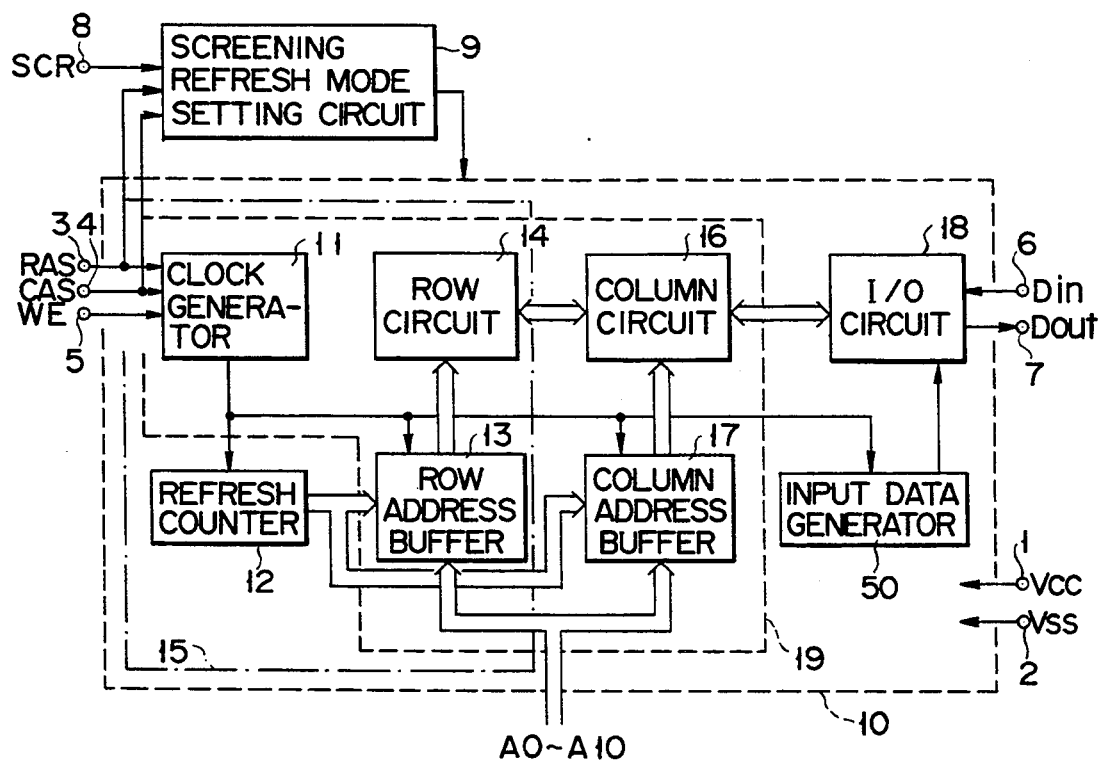
FIG. 5 is a block diagram schematically showing a DRAM according to the second embodiment of the present invention.

FIG. 5 is a block diagram schematically showing the DRAM according to the second embodiment of the present invention.

Figure 6:
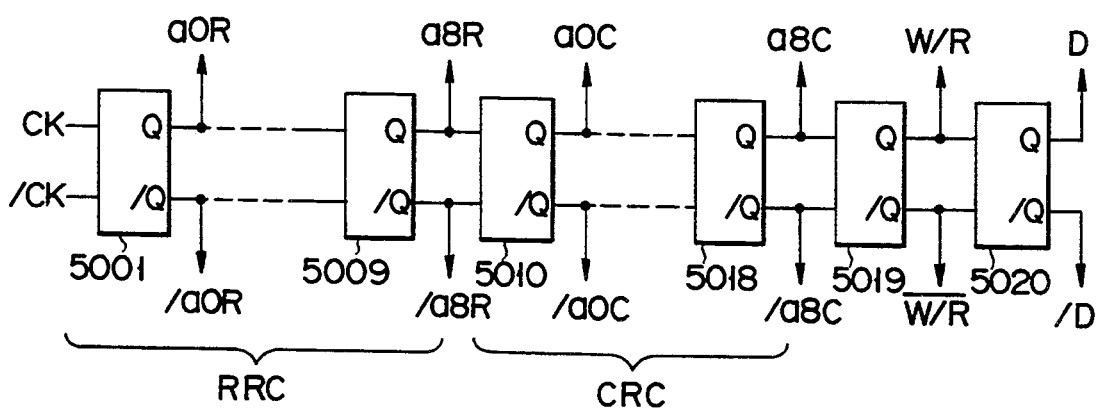
FIG. 6 is a logic circuit diagram showing a refresh counter and an input data generator of the DRAM shown in FIG. 5.

The DRAM shown in FIG. 5 differs from that in FIG. 1 only in the use of an algorithm wherein an input data generator 50 is formed on a chip and supplied with a clock signal from the clock generator 11, the write and read operations are changed to each other after a round of refresh address signals is generated, and the input data is changed to another after a round of write and read operations is completed. A circuit satisfying this algorithm is proposed by the inventors of the present invention in Published Unexamined Japanese Patent Application Nos. 63-66798 and 63-66799 to Furuyama et al. Such a circuit is shown in FIG. 6. The functions of both the input data generator 50 and refresh counter 12 can be performed by the circuit shown in FIG. 6.

As illustrated in FIG. 6, set/reset type flip-flops 5001 to 5020 are connected in series so that outputs signals Q and $\overline{Q}$ of the preceding flip-flop, which are complementary to each other, are supplied as input signals of the succeeding flip-flop. The flip-flop 5001 at the first stage is supplied with clock signals CK and $\overline{CK}$ complementary to each other which are generated from the clock generator 11 when the screening refresh mode is set. The flip-flops 5001 to 5020 at their respective stages divide the frequencies of their input signals in half. The flip-flops 5001 to 5009 at the first to ninth stages constitute the row refresh counter RRC, and the flip-flops 5010 to 5018 at the tenth to eighteenth stages constitute the column refresh counter CRC. The output signals W/R and $\overline{W/R}$ of the flip-flop 5019 at the ninth stage are used as a write/read signal for setting a data write mode and a data read mode. The flip-flop 5020 at the twentieth stage corresponds to the input data generator 50, and their output signals D and $\overline{D}$ complementary to each other are supplied through a data multiplexer (not shown) and used as write data.

In the circuit shown in FIG. 6, Q output signals (a0R to a8R, a0C to a8C, W/R, D) of all the flip-flops 5001 to 50020 are set to "0" level, and $\overline{Q}$ output signals ($\overline{a0R}$ to $\overline{a8R}$, $\overline{a0C}$ to $\overline{a8C}$, $\overline{W/R}$, $\overline{D}$) are set to "1" level by initialization. The write/read signal W/R thus becomes "0" level, the data write mode is set, and the write data becomes "0". If the screening refresh mode is thus selected and the clock signals CK and $\overline{CK}$ are input from the clock generator 11, row address signals a0R to a8R and $\overline{a0R}$ to $\overline{a8R}$, and column address signals a0C to a8C and $\overline{a0C}$ to $\overline{a8C}$ are changed in sequence, and data of "0" level is written in the memory cells of the memory cell array 22. If a round of the row and column address signals is generated, the write/read signal W/R is set at "1" level, and the data read mode is selected. If a round of the row and column address signals is generated again, the write/read signal W/R is set at "0" level, and output data D of the flip-flop 5020 changes from "0" to "1". The data write mode is selected again, and the write data becomes "1". If the row and column address signals are then changed, data of "1" level is written in the memory cells of the memory cell array 22. Further, if a round of the row and column address signals is generated, the write/read signal W/R is set at "1" level, and the data read mode is selected.

There are described in the following four means for supplying the screening signal SCR to the DRAMs shown in FIGS. 1 and 5.

In the first means, as described above, the screening signal SCR is input from outside of the DRAM through the terminal (pad) 8 on a DRAM chip which is in the form of a wafer, or the screening signal SCR is input from outside of the DRAM through the terminal 8 after a DRAM chip is separated from another chips by division of the wafer and then packaged. The number of external terminals necessary for setting the screening refresh mode is five, that is, power source terminal 1, ground terminal 2, RAS terminal 3, CAS terminal 4, and terminal 8.

According to the second means, the screening signal SCR is generated on a DRAM chip on the basis of an address key code which is input as an option of a WCBR (WE and CAS before RAS) mode standardized by the Joint Electron Devices Engineering Council (JEDEC) with respect to the 4-bit DRAM, or a mode which changes to a test mode if the WE and CAS signals are activated when the RAS signal is activated. The number of external terminals necessary for setting the screening refresh mode is six, that is, a terminal for inputting the address key code in addition to power source terminal 1, ground terminal 2, RAS terminal 3, CAS terminal 4, and terminal 8.

According to the third means, a circuit for detecting whether signals, which are input in an order different from that in which signals are input in the normal operation, are input from outside to a plurality of terminals used in the normal operation, is provided, and an output of this circuit is used as the screening signal SCR. The external terminals necessary for setting the screening refresh mode correspond to plural terminals which receive the signal representing the above order, in addition to power source terminal 1 and ground terminal 2.

In the fourth means, a circuit for detecting whether a signal having a value (which is, for example, 7V if power source potential $V_{CC}$ is 5V) within a range not used in the normal operation is input from outside to an arbitrary terminal (which may be used in the normal operation), is provided, and an output of this circuit is used as the screening signal SCR. The number of external terminals necessary for setting the screening refresh mode is three, that is, power source terminal 1, ground terminal 2, and terminal receiving the above signal.

Figure 7:
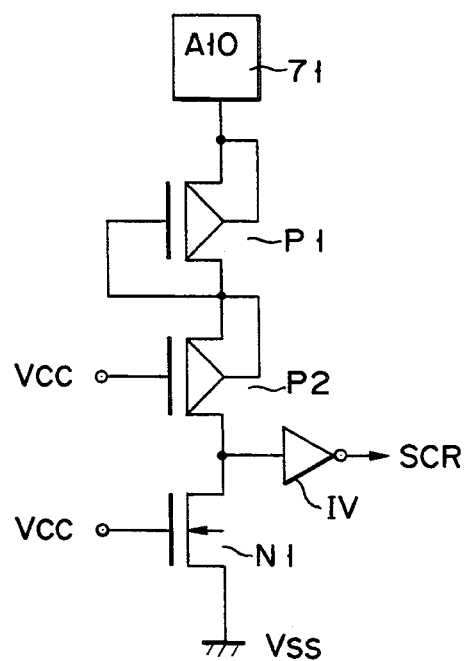
FIG. 7 is a circuit diagram showing a circuit for generating screening signals SCR in the DRAMs shown in FIGS. 1 and 5.

FIG. 7 is a circuit diagram which shows, as an example of the fourth means described above, a ternary control circuit for detecting that a voltage higher than a predetermined voltage is applied to an address terminal 71 of the uppermost bit.

Two P-channel MOS transistors P1 and P2 and one N-channel MOS transistor N1 are connected in series between the address terminal 71 and ground potential $V_{SS}$. The gate and drain of the transistor P1 are connected to each other, and power source potential $V_{CC}$ is applied to the gates of the transistors P2 and N1. An inverter IV is connected to a series-connecting point of the transistors P2 and N1.

In the ternary control circuit, when a normal potential at a high level (corresponding to $V_{CC}$) or at a low level (corresponding to $V_{SS}$) is applied to the address terminal 71, the transistor P1 is turned off and a potential of the input node of the inverter circuit IV is set to be low by the transistor N1 in its ON-state. For this reason, the screening signal SCR output from the inverter Iv becomes high in level (inactive state). A control voltage ($V_{CC}+2vthp$ or more; vthp is a threshold voltage of the P-channel MOS transistor P1), which is higher than $V_{CC}$, is applied to the address terminal 71, the transistor P1 is turned on, the potential of the input node of the inverter IV exceeds $V_{CC}$, and the screening signal SCR output from the inverter IV becomes low in level (active state).

The first embodiment of a method for screening a DRAM according to the present invention will be described.

When the DRAM as shown in FIGS. 1 and 5 is screened, a signal other than the refresh address signal for setting a screening refresh mode is supplied from outside.

In this screening method, if the refresh mode for screening is set when the DRAM is packaged or shaped like a wafer, the screening can be performed by accessing the word lines of a memory in sequence and applying a stress to almost all the transfer gates of the memory. The number of input terminals of the DRAM, or the number of signals input from the input terminals, required for setting the refresh mode for screening is decreased, and an address signal generator need not be provided at the side of a screening apparatus. When a DRAM in the form of a wafer is screened, the number of probe terminals required per chip on the wafer is reduced. A probe card is thus easy to be prepared, the screening is also easy to be performed using a probe, and an address signal generator is not needed at the prober side.

Figure 8:
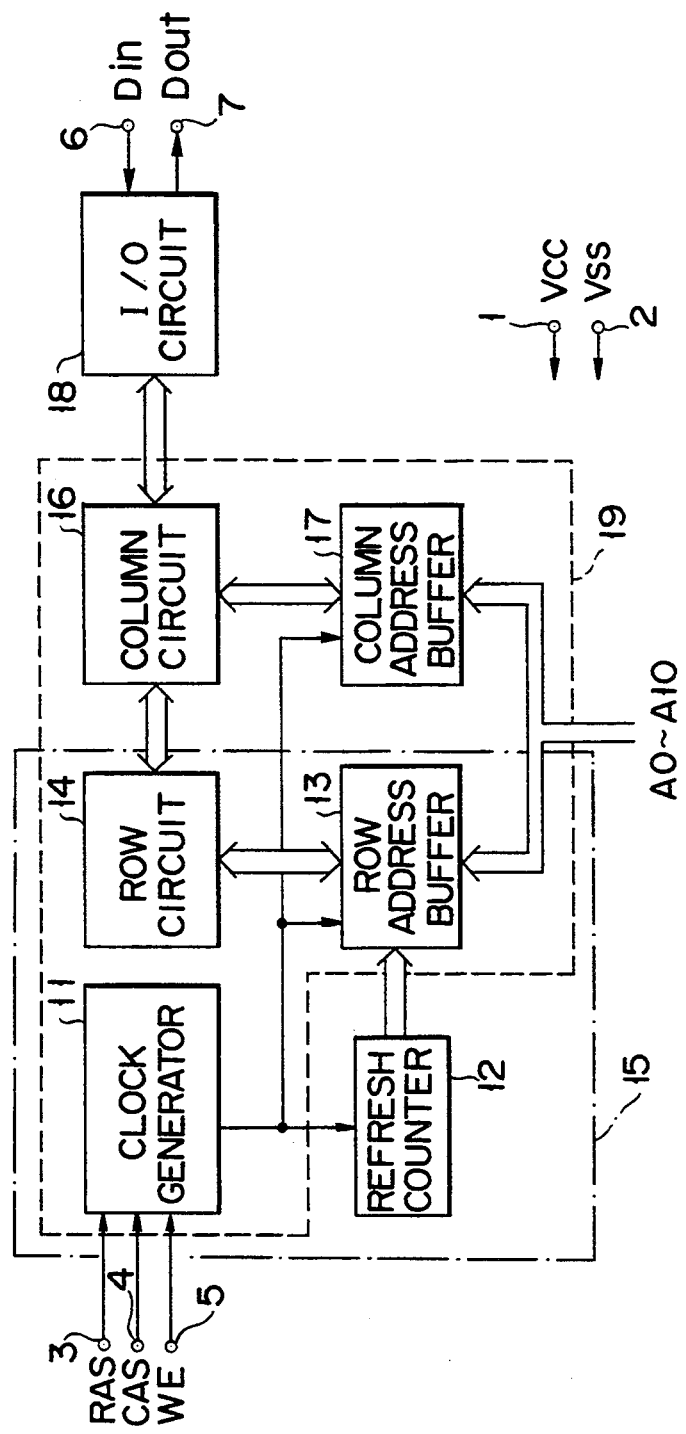
FIG. 8 is a block diagram schematically showing a DRAM according to another embodiment of the present invention which is to be screened.

FIG. 8 is a block diagram schematically showing a DRAM according to another embodiment of the present invention which is to be screened.

Figure 9:
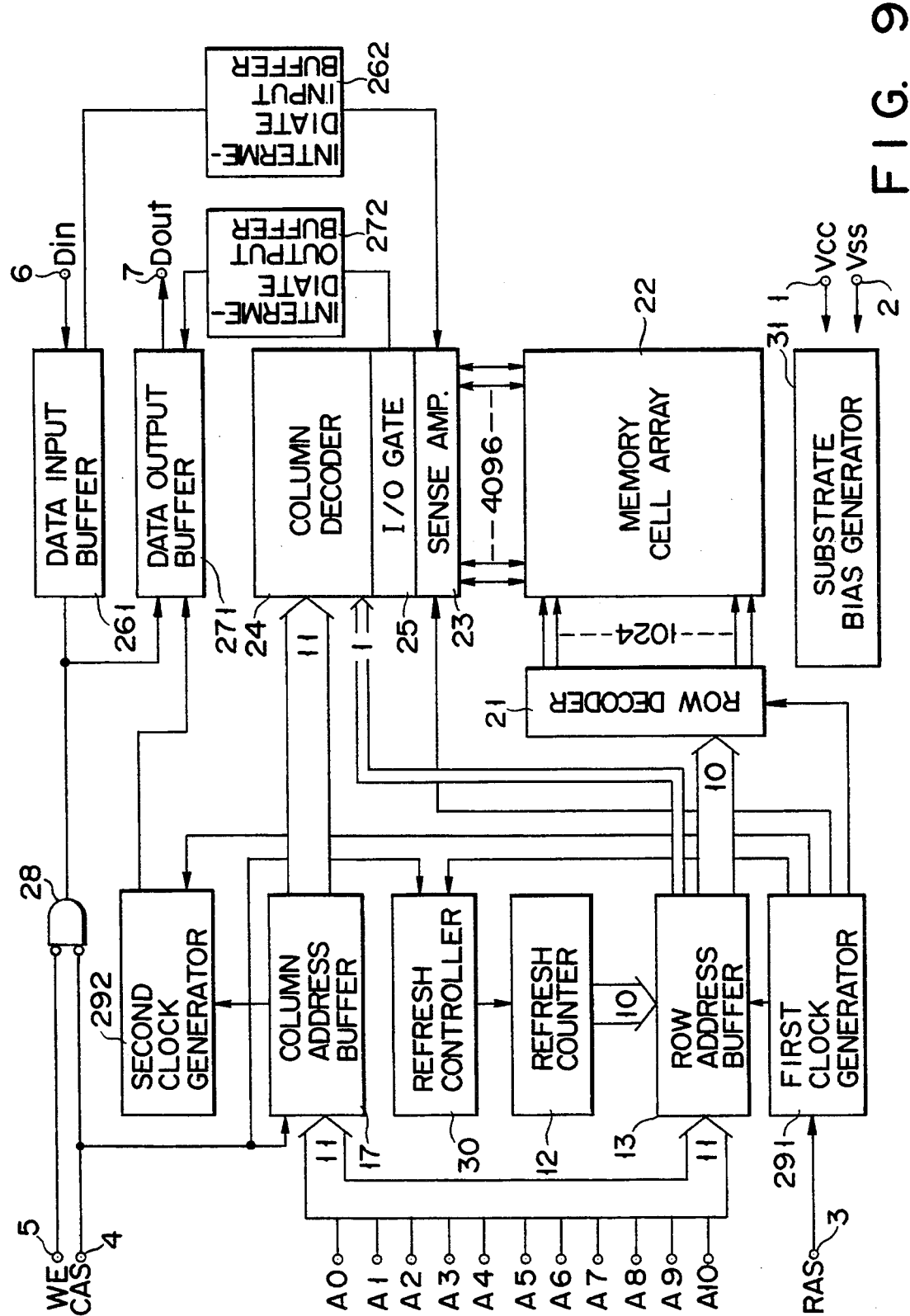
FIG. 9 is a block diagram minutely showing the DRAM shown in FIG. 8.

FIG. 9 is a block diagram minutely showing the DRAM shown in FIG. 8 having a 4M×1 bit structure.

Though the DRAM shown in FIGS. 8 and 9 has a CBR mode and/or a ROR mode as a standard DRAM, it does not have the foregoing refresh mode for screening, nor does the refresh counter 12 supply a refresh address signal to the column address buffer 17.

The second embodiment of a method for screening the DRAM according to the present invention will be described.

When the DRAM shown in FIG. 8 is packaged or shaped like a wafer, it can be set into the CBR mode by applying signals necessary for designating the CBR mode from outside (applying the CAS signal first, and then the RAS signal). The circuit block 15 is thus activated, and a refresh address signal is supplied to the row address buffer 13. A dynamic stress can thus be applied to the activated circuit block 15.

The screening method described above is made effective if the row circuit 14 is intensively and sufficiently screened. However, the row circuit 14 is operated by designating the CBR mode, but the column circuit 16 is not operated; accordingly, only the static stress is applied to the column circuit 16 to which the dynamic stress has been applied in normal operating condition. Further, it is indefinite what initial value is set to the memory cell. The initial value may be set so that the sense amplifier shown in FIG. 9 operates only in a direction of an output having a constant logic level, and a stress cannot be uniformly applied to a sense amplifying system.

According to the second embodiment of the screening method, four external terminals are necessary for setting the CBR mode, namely power source terminal 1, ground terminal 2, RAS terminal 3, and CAS terminal 4. For example, a DRAM having a 4M×1 bit structure requires eighteen address terminals. In screening for the DRAM, the number of terminals necessary for setting the CBR mode in the second embodiment of the screening method is about one fourth of that of terminals in the conventional screening method wherein an address signal is supplied from outside. Consequently, the number of input terminals of the DRAM (or the number of signals input to the DRAM) required for the screening is very small, and an address signal generator need not be provided at the screening apparatus side. When the DRAM in the form of a wafer is screened, probe terminals required per chip on the wafer is decreased in number. A probe card is thus easy to be prepared, a screening is easy to be performed, and an address signal generator need not be provided at the prober side.

The third embodiment of the screening method of the DRAM according to the present invention will be described.

When the DRAM shown in FIG. 8 is packaged or shaped like a wafer, the DRAM is set in the ROR mode by supplying an RAS signal from outside of the DRAM. The circuit block 19 including not only the row circuit 14 but also the column circuit 16 excluding the data output buffer 271, is operated. Though the refresh counter 12 is not then operated, if a row address signal is supplied from outside of the DRAM, a stress can be applied to both the row and column circuits 14 and 16.

The screening method described above is effective if the column circuit 16 is intensively and practically screened and, in other words, is effective when a stress test for the sense amplifier 23 or a transfer circuit for transferring data from the sense amplifier 23 is carried out after a stress test for the word lines of the memory cell array 22 shown in FIG. 9 is finished.

According to the third embodiment of the screening method, since three external terminals of power source terminal 1, ground terminal 2 and RAS terminal 3 are required for setting the ROR mode, the number of input terminals of the DRAM (the number of signals input to the DRAM) necessary for the screening is smaller than that in the conventional screening method.

The present invention is not limited to the above-described embodiments. Various changes and modifications can be made without departing from the spirit and scope of the invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A dynamic memory device with power and ground terminals and having a row address buffer and a column address buffer, the device comprising:
   a refresh counter connected to the row and column address buffers;
   a row circuit connected to the row address buffer;
   a column circuit connected to the column address buffer; and
   control circuitry receiving a screening signal and controlling the dynamic memory device to operate in a designated mode according to the screening signal, the designated mode including one of a normal mode and a screening refresh mode, the normal mode including one of a CBR (CAS Before ROR) mode and an ROR (RAS Only Refresh) mode, the screening refresh mode applying a dynamic stress uniformly to and exposing latent defects in the dynamic memory device, the control circuitry combining the screening signal with at least one of an RAS(Row Address Strobe) and a CAS (Column Address Strobe) to designate the screening refresh mode, the control circuitry activating the refresh counter, the row circuit and the column circuit when the screening refresh mode is designated and power is applied between the power and ground terminals at a supply voltage greater than a normal working voltage.

2. The dynamic memory device according to claim 1, wherein said row circuit includes a row decoder, a memory cell array, and a sense amplifier, and said column circuit includes a column decoder and an I/O (Input/Output) gate.

3. The dynamic memory device according to claim 1, further comprising a CAS terminal for receiving the CAS and an RAS terminal for receiving the RAS and an additional terminal, wherein said screening refresh mode is set using only the power terminal, the ground terminal, the RAS terminal, the CAS terminal, and the additional terminal.

4. The dynamic memory device according to claim 1, further comprising a CAS terminal for receiving the CAS and an RAS terminal for receiving the RAS and a WE terminal and an additional terminal, wherein said screening refresh mode is set using only the power terminal, the ground terminal, the RAS terminal, the CAS terminal, the WE terminal, and the additional terminal.

5. The dynamic memory device according to claim 1, further comprising an RAS terminal for receiving the RAS and an additional terminal, wherein said screening refresh mode is set using only the power terminal, the ground terminal, the RAS terminal, and the additional terminal.

6. The dynamic memory device of claim 1, wherein the refresh counter outputs a refresh address signal, the refresh address signal being supplied to both the row address buffer and the column address buffer.

7. The dynamic memory device of claim 1, wherein the refresh counter includes a row refresh counter and a column refresh counter, the row refresh counter outputting a row refresh address signal supplied to the row address buffer, the column refresh counter outputting a column address signal supplied to the column address buffer.

8. The dynamic memory device of claim 1, further comprising a dedicated screening terminal for receiving signal external to the dynamic memory device, the screening signal being input from the dedicated screening terminal.

9. The dynamic memory device of claim 1, wherein the control circuitry designates the screening refresh mode when a WE (write enable) signal, an address key code and the CAS is received by the control circuitry before the RAS while the control circuitry is receiving the screening signal.

10. The dynamic memory device of claim 1, wherein the control circuitry includes:
   detecting circuitry for detecting an order in which signals received by the control circuitry are received;

designating circuitry for designating the designated mode as being the normal mode when the detected order of the signals received by the control circuitry is a first order, and for designating the designated mode as being the screening refresh mode when the detected order of the signals received by the control circuitry is a second order, different from the first order.

11. The dynamic memory device of claim 1, further comprising an arbitrary terminal, wherein:

an arbitrary signal received at the arbitrary terminal by the control circuitry is characterized as having a potential within a normal potential range when the control circuitry controls the dynamic memory device to operate in the normal mode; and the control circuitry includes (1) detection circuitry for detecting when the arbitrary signal is received by the control circuitry while being characterized as having a potential outside of the normal potential range, and (ii) designating circuitry for designating the designated mode as being the screening refresh mode when the detection circuitry detects the arbitrary signal as being received by the control circuitry while being characterized as having a potential outside of the normal potential range.

12. The dynamic memory device of claim 1, wherein the control circuitry controls the dynamic memory device to operate in the screening refresh mode while the dynamic memory device is unseparated from a wafer having a plurality of circuits.

13. A dynamic memory device which inputs an RAS (Row Address Strobe) and a CAS (Column Address Strobe) to designate one of a CBR (CAS Before RAS) mode and an ROR (RAS Only Refresh) mode, each of the CBR and ROR modes constituting a normal operating mode, the dynamic memory device comprising:

a clock generator;

a refresh counter incremented by the clock generator for generating an output signal;

a row address buffer for receiving one of a row address signal and a first part of the output signal of said refresh counter;

a row circuit connected to the row address buffer;

a column address buffer for receiving one of a column address signal and a second part of the output signal of said refresh counter;

a column circuit connected to the column address buffer and the row circuit; and a screening refresh mode setting circuit, receiving a screening signal, for (i) outputting a detection signal when the screening signal is received while the RAS and CAS are designating one of the CBR and ROR modes, (ii) designating a screening refresh mode when the screening refresh mode setting circuit outputs the detection signal, (iii) activating the clock generator, refresh counter, row address buffer, row circuit, column address buffer and column circuit when the screening mode refresh setting circuit outputs the detection signal and (iv) designating one of the normal operating modes when the screening refresh mode setting circuit does not output the detection signal.

14. In a dynamic memory circuit with power and ground terminals, a screening signal input terminal, and at least one input mode terminal for receiving at least one corresponding signal, the at least one corresponding signal being for designating a normal refresh mode, the normal refresh mode being one of an ROR (RAS Only Refresh) mode and a CBR (CAS Before RAS) mode, a method for stress testing the dynamic memory circuit comprising steps of:

applying power between the power and ground terminals at a supply voltage greater than a normal working voltage for the dynamic memory device;

supplying the screening signal to the screening signal input terminal from an external screening signal source; and designating a designated mode, the designated mode being one of the CBR mode and the ROR mode so that the dynamic memory device operates in a screening refresh mode when the screening signal is supplied to the dynamic memory device.

15. The method of claim 14, wherein the step of supplying includes supplying the screening signal while the dynamic memory device is unseparated from a wafer having a plurality of circuits.

16. The method of claim 14, further comprising a step of generating a column address and connecting the column address to a column circuit of the dynamic memory device when the designated mode is designated while the screening signal is supplied.

17. The method of claim 16, wherein the step of generating includes uniformly applying a voltage stress to the column circuit.

18. The method of claim 14, further comprising a step of generating a data signal and a read/write signal and connecting the data and read/write signals to a column circuit of the dynamic memory device when the designated mode is designated while the screening signal is supplied, the row circuit including a memory cell array with at least one transfer gate.

19. The method of claim 18, wherein the step of generating includes uniformly applying a voltage stress to a first transfer gate of the memory cell array.

20. The method of claim 14, further comprising a step of operating a data output buffer of the dynamic memory device when the designated mode is designated while the screening signal is supplied.

21. The method of claim 20, wherein the step of operating includes uniformly applying a voltage stress to the data output buffer.

* * * * *